(12) United States Patent
Hwang et al.

(10) Patent No.: US 7,601,591 B2
(45) Date of Patent: *Oct. 13, 2009

(54) METHOD OF MANUFACTURING SIDEWALL SPACERS ON A MEMORY DEVICE, AND DEVICE COMPRISING SAME

(75) Inventors: David K. Hwang, Boise, ID (US); Kunal Parekh, Boise, ID (US); Michael Willett, Boise, ID (US); Jigish Trivedi, Boise, ID (US); Suraj Mathew, Boise, ID (US); Greg Peterson, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/020,752

(22) Filed: Jan. 28, 2008

(65) Prior Publication Data

US 2008/0119053 A1 May 22, 2008

(51) Int. Cl.
*H01L 21/8247* (2006.01)
(52) U.S. Cl. ............................ 438/258; 257/E21.179
(58) Field of Classification Search ................. 438/241, 438/257–267, 275, 595–596; 257/E21.179
See application file for complete search history.

(56) References Cited

U.S. PATENT DOCUMENTS

| | | | |
|---|---|---|---|
| 5,063,172 A | 11/1991 | Manley | 438/265 |
| 5,552,331 A | 9/1996 | Hsu et al. | 438/258 |
| 5,573,965 A | 11/1996 | Chen et al. | 437/41 |
| 5,629,220 A | 5/1997 | Yang | 438/286 |
| 5,696,012 A | 12/1997 | Son | 437/44 |
| 5,696,019 A | 12/1997 | Chang | 438/221 |
| 5,783,475 A | 7/1998 | Ramaswami | 438/303 |

(Continued)

FOREIGN PATENT DOCUMENTS

WO PCT/US2006/017367   5/2006

(Continued)

*Primary Examiner*—Richard A. Booth
(74) *Attorney, Agent, or Firm*—Wells St. John P.S.

(57) ABSTRACT

The present invention is generally directed to a method of manufacturing sidewall spacers on a memory device, and a memory device comprising such sidewall spacers. In one illustrative embodiment, the method includes forming sidewall spacers on a memory device comprised of a memory array and at least one peripheral circuit by forming a first sidewall spacer adjacent a word line structure in the memory array, the first sidewall spacer having a first thickness and forming a second sidewall spacer adjacent a transistor structure in the peripheral circuit, the second sidewall spacer having a second thickness that is greater than the first thickness, wherein the first and second sidewall spacers comprise material from a single layer of spacer material. In one illustrative embodiment, the device includes a memory array comprised of a plurality of word line structures, each of the plurality of word line structures having a first sidewall spacer formed adjacent thereto, the first sidewall spacer having a first thickness, and a peripheral circuit comprised of at least one transistor having a second sidewall spacer formed adjacent thereto, the second sidewall spacer having a second thickness that is greater than the first thickness, the first and second sidewall spacers comprised of a material from a single layer of spacer material.

17 Claims, 10 Drawing Sheets

U.S. PATENT DOCUMENTS

| | | | |
|---|---|---|---|
| 5,856,219 A | 1/1999 | Naito et al. | 438/241 |
| 5,933,730 A | 8/1999 | Sun et al. | 438/258 |
| 6,248,623 B1 | 6/2001 | Chien et al. | |
| 6,403,487 B1 | 6/2002 | Huang et al. | 438/706 |
| 6,429,108 B1 | 8/2002 | Chang et al. | 438/587 |
| 6,455,362 B1 | 9/2002 | Tran et al. | 438/194 |
| 6,750,487 B2 | 6/2004 | Fried et al. | 257/270 |
| 6,808,992 B1 | 10/2004 | Ko et al. | 438/283 |
| 6,927,129 B1 | 8/2005 | Sun et al. | 438/258 |
| 6,927,461 B2 | 8/2005 | Kim et al. | 257/382 |
| 6,943,077 B2 | 9/2005 | Liu et al. | 438/230 |
| 7,009,240 B1 | 3/2006 | Basceri et al. | 257/306 |
| 7,064,026 B2 | 6/2006 | Kim et al. | 438/230 |
| 7,341,906 B2 * | 3/2008 | Hwang et al. | 438/238 |
| 2001/0023123 A1 | 9/2001 | Kim | |
| 2002/0098704 A1 | 7/2002 | Chien et al. | 438/694 |
| 2002/0197786 A1 | 12/2002 | Cho et al. | 438/238 |
| 2003/0151069 A1 | 8/2003 | Sugimae et al. | 257/200 |
| 2004/0211981 A1 | 10/2004 | Terauchi et al. | 257/202 |
| 2004/0256645 A1 | 12/2004 | Tsuchiaki et al. | 257/288 |
| 2005/0056835 A1 | 3/2005 | Yin et al. | 257/52 |
| 2005/0056940 A1 | 3/2005 | Sandhu et al. | 257/770 |
| 2005/0059262 A1 | 3/2005 | Yin et al. | 438/780 |
| 2007/0032011 A1 | 2/2007 | Parekh et al. | 438/238 |

FOREIGN PATENT DOCUMENTS

| | | |
|---|---|---|
| WO | WO2006/017367 | 5/2006 |
| WO | PCT/US2006/017367 | 11/2006 |

* cited by examiner

METHOD OF MANUFACTURING SIDEWALL SPACERS ON A MEMORY DEVICE, AND DEVICE COMPRISING SAME

BACKGROUND OF THE INVENTION

1. Field of the Invention

The present invention is generally related to the field of manufacturing integrated circuit devices, and, more particularly, to a method of manufacturing sidewall spacers on a memory device, and a memory device comprising such sidewall spacers.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of various features of the integrated circuit devices, e.g., transistors, word lines, etc. For example, all other things being equal, the smaller the channel length of the transistor, the faster the transistor will operate. Thus, there is a constant drive to reduce the size, or scale, of the features of a typical memory device to increase the overall speed and capabilities of the memory device, as well as electronic devices incorporating such memory devices.

A variety of semiconductor memory devices are used extensively in many consumer products. Illustrative examples of such memory devices are dynamic random access memory (DRAMs) and flash memory devices. FIG. 1A depicts an illustrative layout of a schematically depicted DRAM memory device 17 that is formed on a die 19 comprised of a semiconducting substrate 13. In general, the memory device 17 is comprised of a memory array 10 and a plurality of peripheral circuits 12. By way of example only, a plurality of schematically depicted illustrative peripheral circuits 12 are depicted in FIG. 1A. More specifically, the illustrative peripheral circuits 12 comprise read-write circuits 12A, sense amp circuits 12B and power management circuits 12C. Of course, the illustrative peripheral circuits depicted in FIG. 1A are not exhaustive of all such peripheral circuits 12 on the memory device 17. In general, the peripheral circuit 12 may comprise any circuitry on the memory device 17 other than the circuitry found within the memory array 10.

The memory array 17 includes a multitude of memory cells arranged in rows and columns. Each of the memory cells is structured for storing digital information in the form of a logical high (i.e., a "1") or a logical low (i.e., a "0"). To write (i.e., store) a bit into a memory cell, a binary address having portions identifying the cell's row (the "row address") and column (the "column address") is provided to addressing circuitry in the memory device 17 to activate the cell, and bit is then supplied to the cell. Similarly, to read (i.e., retrieve) a bit from a memory cell, the cell is again activated using the cell's memory address and the bit is then output from the cell.

FIG. 1B is a cross-sectional view of a portion of the illustrative memory device 17 depicted in FIG. 1A. Depicted therein is an illustrative transistor 15, which is a portion of a peripheral circuit 12, and a plurality of word lines 11 within the memory array 10. Typically, the memory array 10 is much more densely packed than the peripheral circuits 12, i.e., the pitch between adjacent word lines 11 within the memory array 10 is typically much tighter than it is in the peripheral circuits 12. For example, the spacing 32 between adjacent features, i.e., word lines 11, in the memory array 10 may be approximately 50-90 nm, whereas the spacing between adjacent features, e.g., transistors 15 in the peripheral circuits 12, may be on the order of approximately 240-600 nm.

As indicated in FIG. 1B, the illustrative transistor 15 comprises a gate insulation layer 14, a gate electrode 16, a metal layer 18 and a cap layer 20 comprised of, for example, silicon nitride. The transistor 15 further comprises a plurality of source/drain regions 24 and a sidewall spacer 22. The word lines 11 within the memory array 10 also include a similar structure. The feature size 30 of the word lines 11 may be on the order of approximately 50-90 nm. Typically, the word lines 11 in the memory array 10 may have a pitch of approximately two times the feature size of the word lines 11. Thus, the spacing 32 between adjacent word lines 11 in the array 10 may be approximately equal to the feature size of the word line 11. A sidewall spacer 34 is also formed adjacent the word lines 11 depicted in FIG. 1B. Lastly, isolation regions 28 are formed in the substrate 13 as is well known in the art.

Typically, the sidewall spacers 22 on the peripheral circuits 12, as well as the sidewall spacers 34 formed in the memory array 10, are formed at the same time from the same layer of material. Thus, the thickness 26 of the spacers 22 formed in the peripheral circuits 12 is approximately the same as the thickness 36 of the spacers 34 formed within the memory array 10. Due to the densely packed nature of the word lines 11 in the memory array 10, the thickness of the spacers 22, 34 is limited by the size of a spacer that may be reliably formed in the very small spacing 32 between adjacent word lines 11. This is problematic in that, for a variety of reasons, it may be desirable to make the spacer 22 on the peripheral circuits 12 thicker than the spacer 34 within the memory array 10. For example, formation of the source/drain regions 24 of the transistors 15 in the peripheral circuits 12 generally involves an initial LDD implant, followed by the formation of spacers 22 and then followed by a source/drain implant step. However, given that the thickness 26 of the spacer 22 is constrained by the spacing 32 between the word lines 11 in the memory array 10, the source/drain regions 24 on the peripheral circuits 12 may not be located as precisely or formed as deep as they would otherwise be if the formation of the spacers 22 was independent of the formation of the spacers 34.

The present invention is directed to various methods and devices that may solve, or at least reduce, some or all of the aforementioned problems.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present invention is generally directed to a method of manufacturing sidewall spacers on a memory device, and a memory device comprising such sidewall spacers. In one illustrative embodiment, the method comprises forming sidewall spacers on a memory device comprised of a memory array and at least one peripheral circuit by forming a first sidewall spacer adjacent a word line structure in the memory array, the first sidewall spacer having a first thickness and forming a second sidewall spacer adjacent a transistor structure in the peripheral circuit, the second sidewall spacer having a second thickness that is greater than the first thickness, wherein the first and second sidewall spacers comprise material from a single layer of spacer material.

In another illustrative embodiment, the method comprises forming a layer of spacer material above a word line structure of a memory array of a memory device and above a transistor structure of a peripheral circuit of the memory device, forming a masking layer above the layer of spacer material positioned above the transistor structure of the peripheral circuit, and performing an etching process on the layer of spacer material above the word line structure to define a first sidewall spacer for the word line structure, the first sidewall spacer being comprised of the spacer material and having a first thickness.

In yet another illustrative embodiment, the method comprises depositing a layer of spacer material above a word line structure of a memory array of a memory device and above a transistor structure of a peripheral circuit of the memory device, forming a masking layer above the layer of spacer material positioned above the transistor structure of the peripheral circuit, and performing an anisotropic etching process on the layer of spacer material above the word line structure to define a first sidewall spacer for the word line structure, the first sidewall spacer being comprised of the spacer material and having a first thickness. The method further comprises forming a layer of epitaxial silicon on exposed portions of a semiconducting substrate between first sidewall spacers positioned on adjacent word line structures in the memory array, and depositing a layer of material above the layer of spacer material adjacent the transistor structure and above the word line structure and the first sidewall spacer, the layer of material being comprised of a material that is selectively etchable with respect to the layer of spacer material. The method further involves performing an anisotropic etching process on the layer of material to define a masking spacer adjacent the layer of spacer material adjacent the transistor structure, and performing an etching process on the layer of spacer material using the masking spacer as a mask to define a second sidewall spacer adjacent the transistor structure, the second sidewall spacer being comprised of the spacer material and having a second thickness that is greater than the first thickness of the first sidewall spacer.

In one illustrative embodiment, the device comprises a memory array comprised of a plurality of word line structures, each of the plurality of word line structures having a first sidewall spacer formed adjacent thereto, the first sidewall spacer having a first thickness, and a peripheral circuit comprised of at least one transistor having a second sidewall spacer formed adjacent thereto, the second sidewall spacer having a second thickness that is greater than the first thickness, the first and second sidewall spacers comprised of a material from a single layer of spacer material.

BRIEF DESCRIPTION OF THE DRAWINGS

The invention may be understood by reference to the following description taken in conjunction with the accompanying drawings, in which like reference numerals identify like elements, and in which.

Figure 1A:
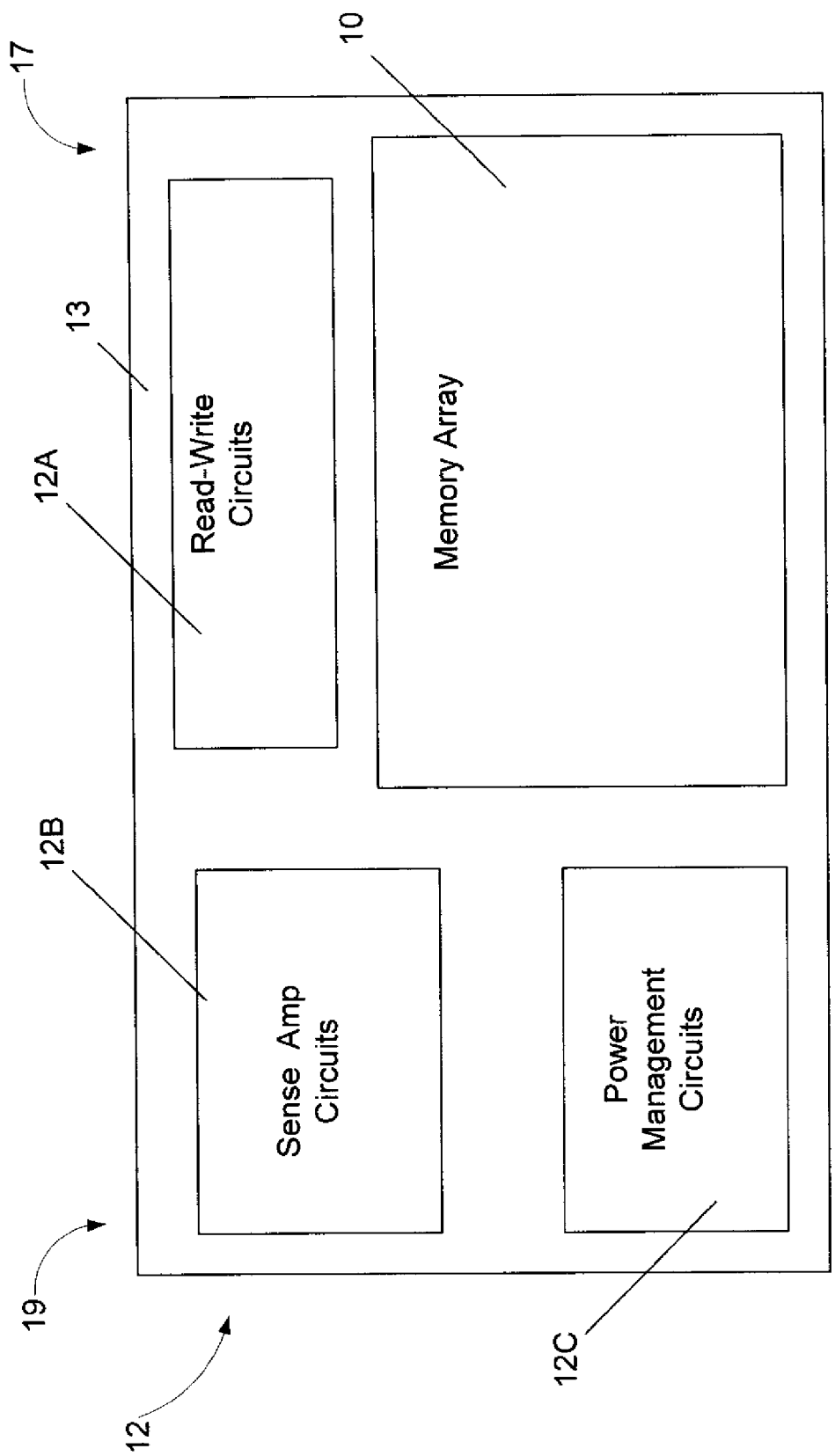
FIG. 1A is a schematic depiction of a plan view of an illustrative prior art memory device.
Figure 1B:
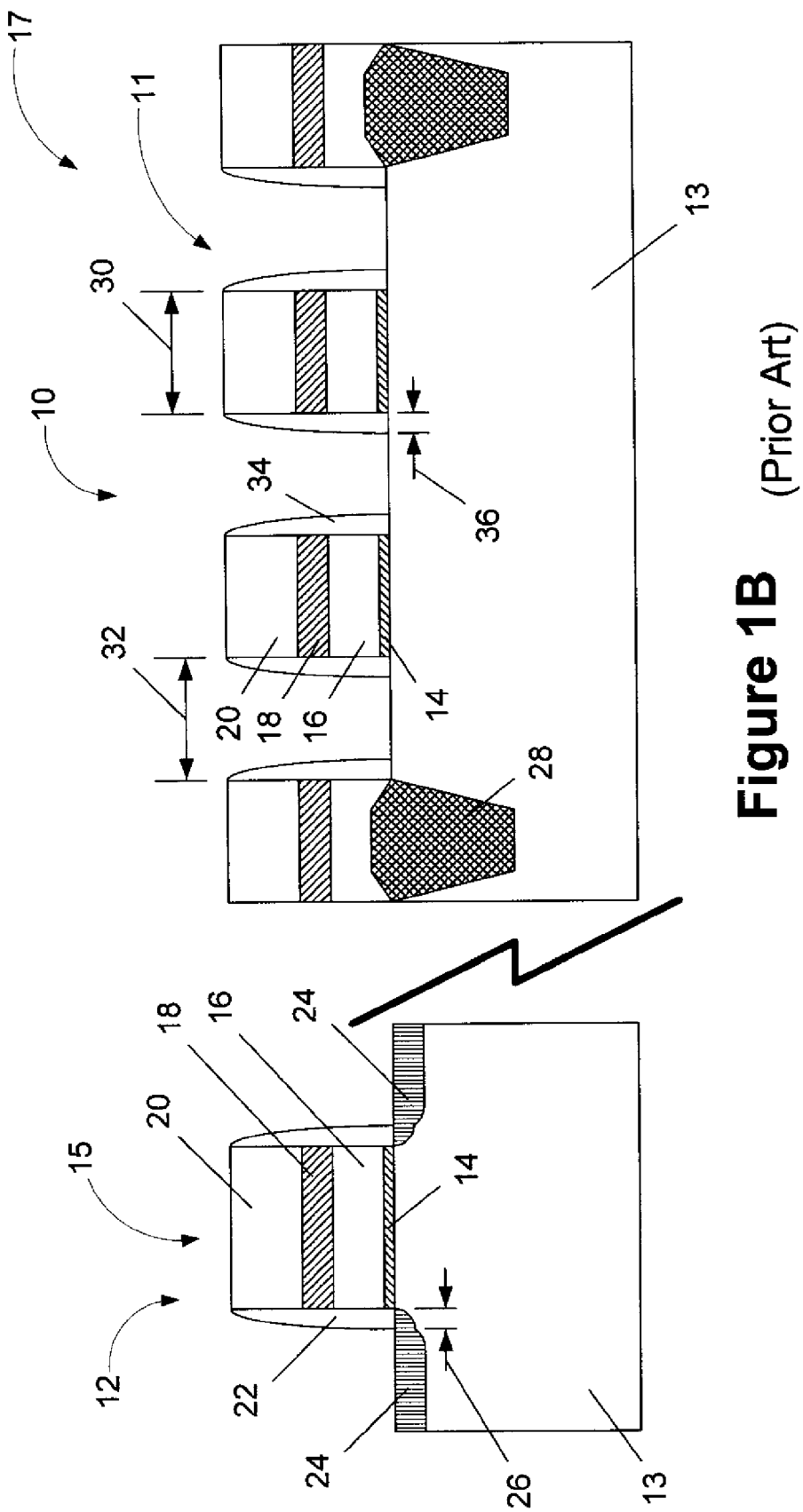
FIG. 1B is a partial cross-section of the prior art memory device depicted in FIG. 1A.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

FIGS. 2A-2H depict one illustrative embodiment of a method of manufacturing sidewall spacers on a memory device 17 in accordance with the present invention. As will be recognized by those skilled in the art after a complete reading of the present application, the present invention has broad application and may be employed in manufacturing a variety of memory devices, e.g., DRAMs, flash memory, PROMs, OTP (one time programmable) devices, etc. Moreover, the illustrative memory device 17 depicted herein may be employed in a variety of products, e.g., computers, televisions, and other forms of electronic devices. Thus, the illustrative examples depicted herein should not be considered as limitations of the present invention.

Figure 2A:
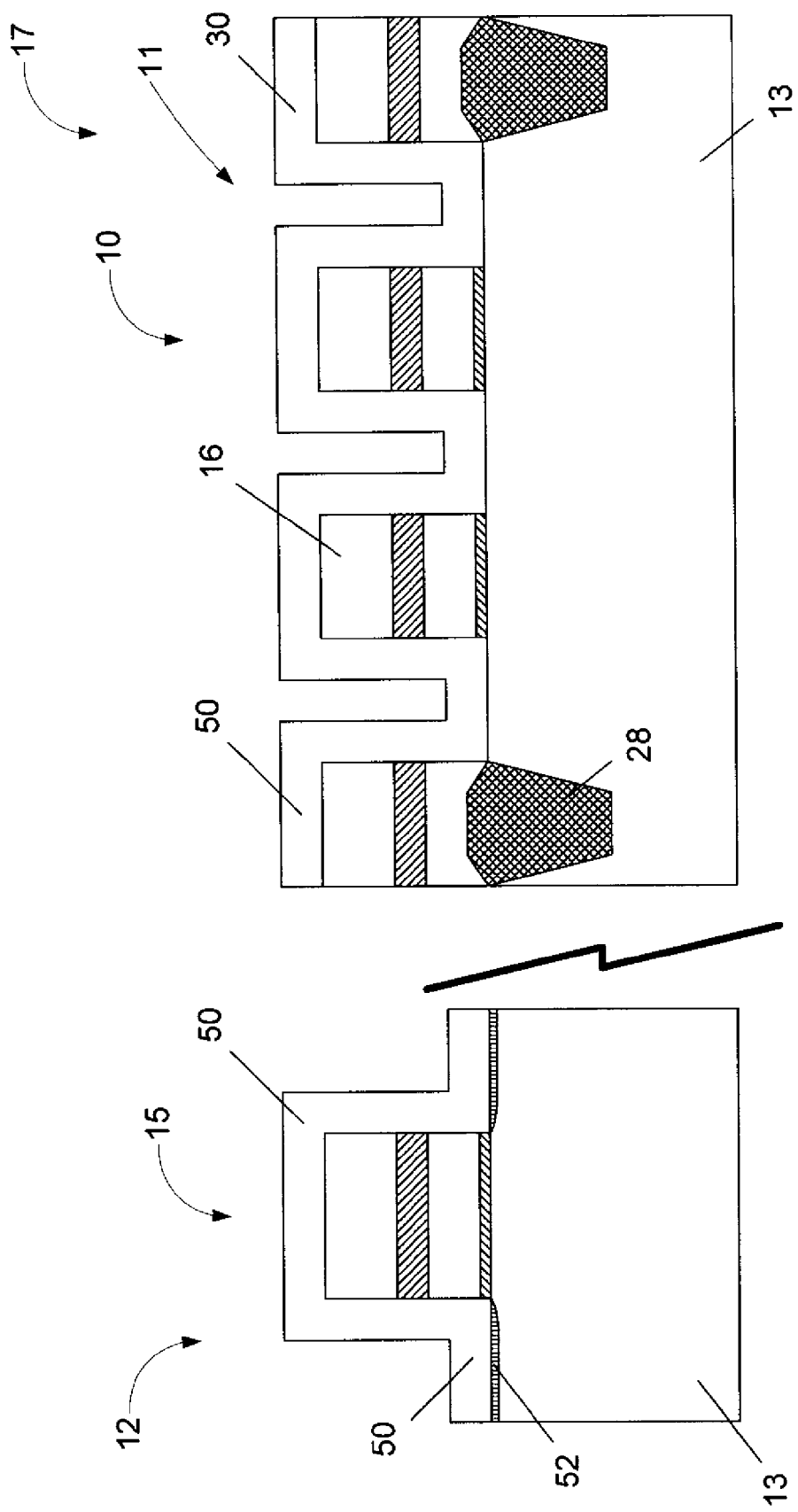
FIGS. 2A-2H depict one illustrative process flow for forming the sidewall spacers on a memory device in accordance with the present invention.

FIG. 2A depicts an illustrative memory device 17 at the point of manufacture at which the gate stack structure of the transistor 15 in the peripheral circuits 12 has been formed and the word line 11 stacks in the memory array 10 have also been formed. Also, at this point in the fabrication process, an ion implantation process has been performed to form LDD regions 52 in the substrate 13 for the transistor 15. All of the processing depicted up to this point of fabrication of the memory device 17 may be performed in accordance with known manufacturing techniques.

As indicated in FIG. 2A, a layer of spacer material 50 is formed across the substrate 13 in the peripheral circuits region 12 as well as the memory array region 10. The layer of spacer material 50 may be comprised of a variety of different materials that may be formed by a variety of known techniques. For example, the layer of spacer material 50 may be comprised of silicon nitride, silicon oxynitride, or materials that may be selectively etched with respect to silicon or silicon dioxide. The thickness of the layer of spacer material may vary. In one illustrative embodiment, the layer of spacer material 50 may have a thickness of approximately 10-30 nm, and, in one particularly illustrative embodiment, the thickness may be approximately 15-27 nm. The layer of spacer material 50 may be formed by performing a variety of known deposition processes, e.g., a conformal chemical vapor deposition process, a plasma enhanced chemical vapor deposition process, atomic layer deposition, etc.

Figure 2B:
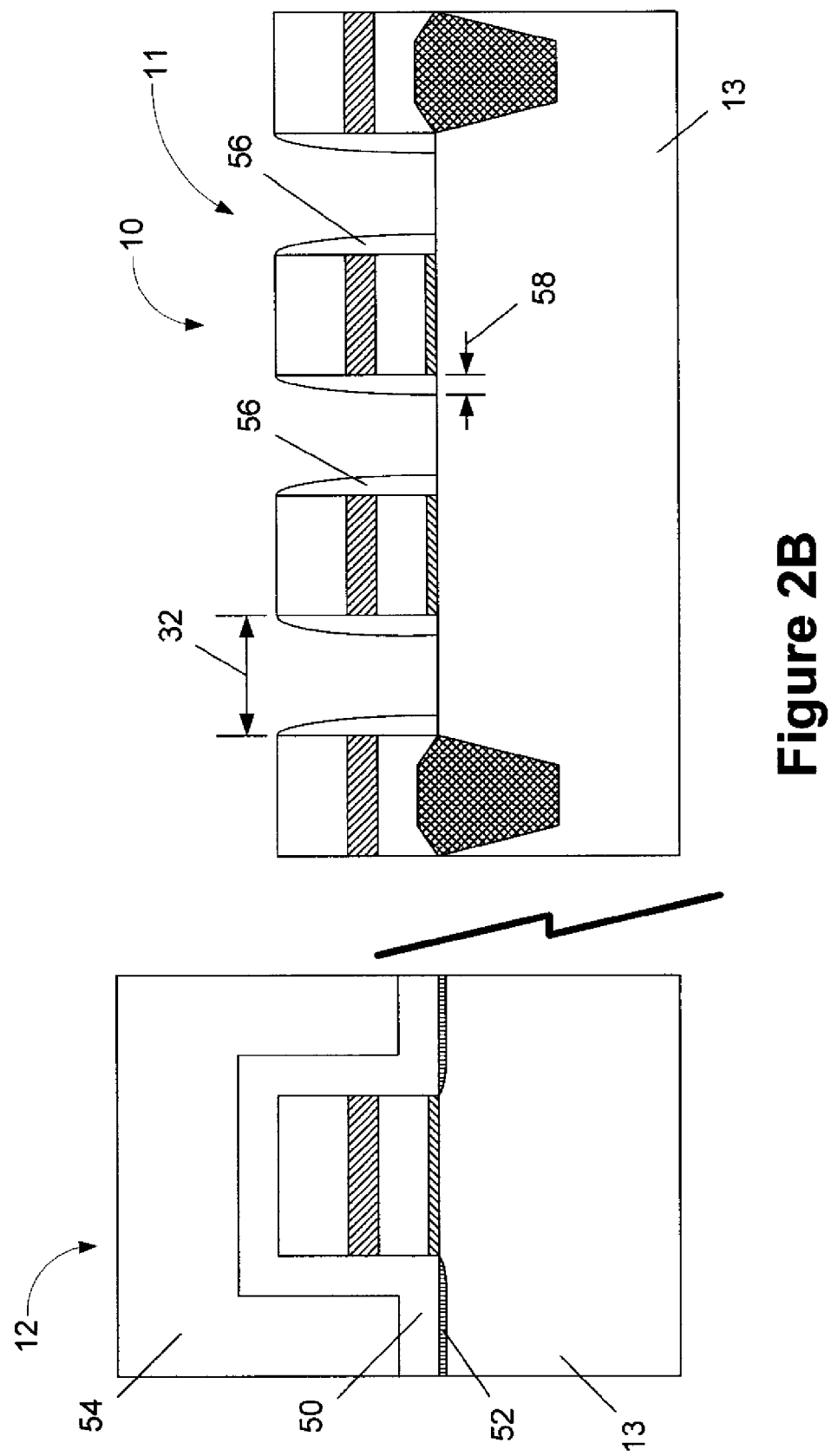

Next, as indicated in FIG. 2B, a photoresist mask 54 is formed above the peripheral circuits 12 while leaving the memory array 10 exposed for further processing. Also as indicated in FIG. 2B, an etching process, e.g., an anisotropic etching process, has been performed on the layer of spacer material 50 to define sidewall spacers 56 adjacent the word lines 11 in the memory array 10. The spacers 56 in the memory array 10 have a generally tapered cross-sectional configuration and a thickness 58. In one illustrative embodiment, the thickness 58 of the spacers 56 may be approximately 30% of the space 32 between the word lines 11. In one particularly illustrative embodiment, the thickness 58 of the spacers 56 may be approximately 15-27 nm. The etching process parameters and the etchant materials employed to form the spacers 56 to the desired thickness 58 are well known to those skilled in the art and will not be discussed further so as to not obscure the present invention.

Figure 2C:
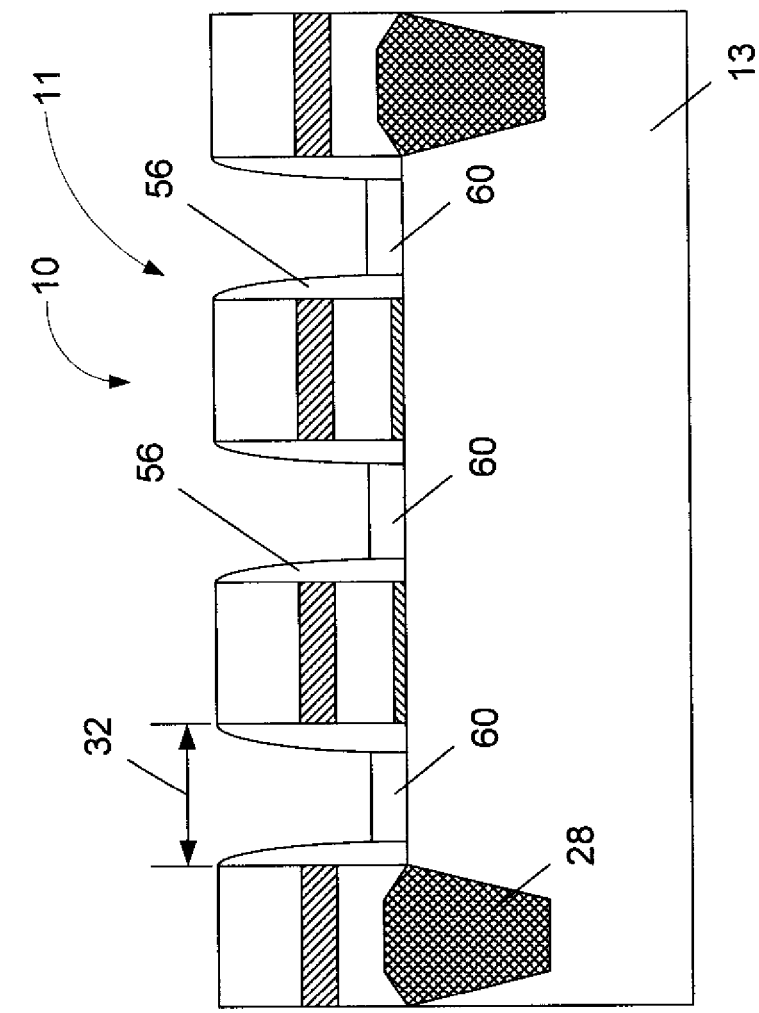
Figure 2C:
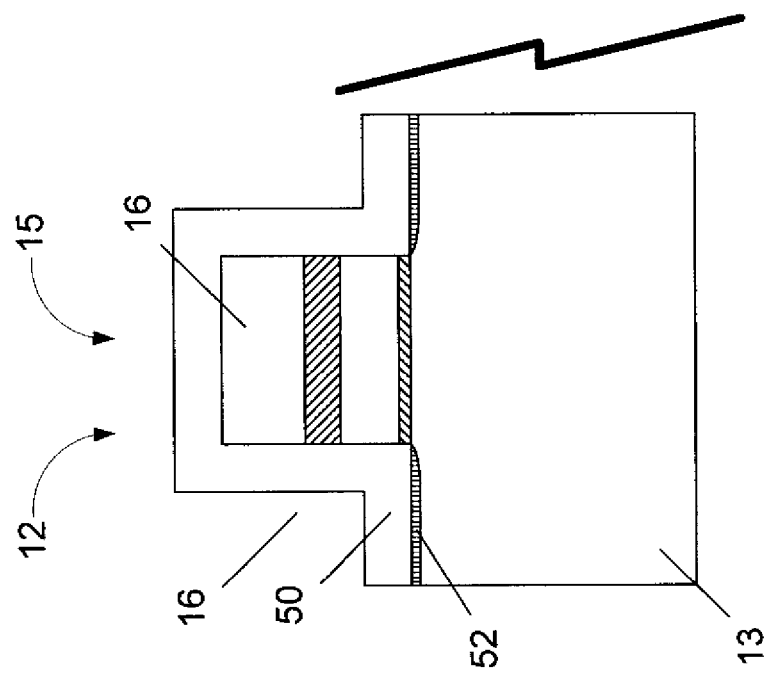

Next, as shown in FIG. 2C, the photoresist mask 54 is removed from above the peripheral circuits 12 using a variety of known techniques, e.g., ashing. Thereafter, a protective layer of material 60 is grown within the memory array 10 on the substrate 13 within the area defined by the spacers 56 on the word lines 11. This protective layer 60 will be employed to protect the substrate 13 during a later etching process described more fully below. In one illustrative embodiment, the protective layer 60 may be comprised of epitaxial silicon. The layer of epitaxial silicon 60 may be formed using a variety of known epitaxial growth processes and it may have a thickness that ranges from approximately 20-60 nm. Note that during this process, the layer of spacer material 50 prevents the formation of the epitaxial layer 60 on the substrate 13 in the peripheral circuits 12.

Figure 2D:
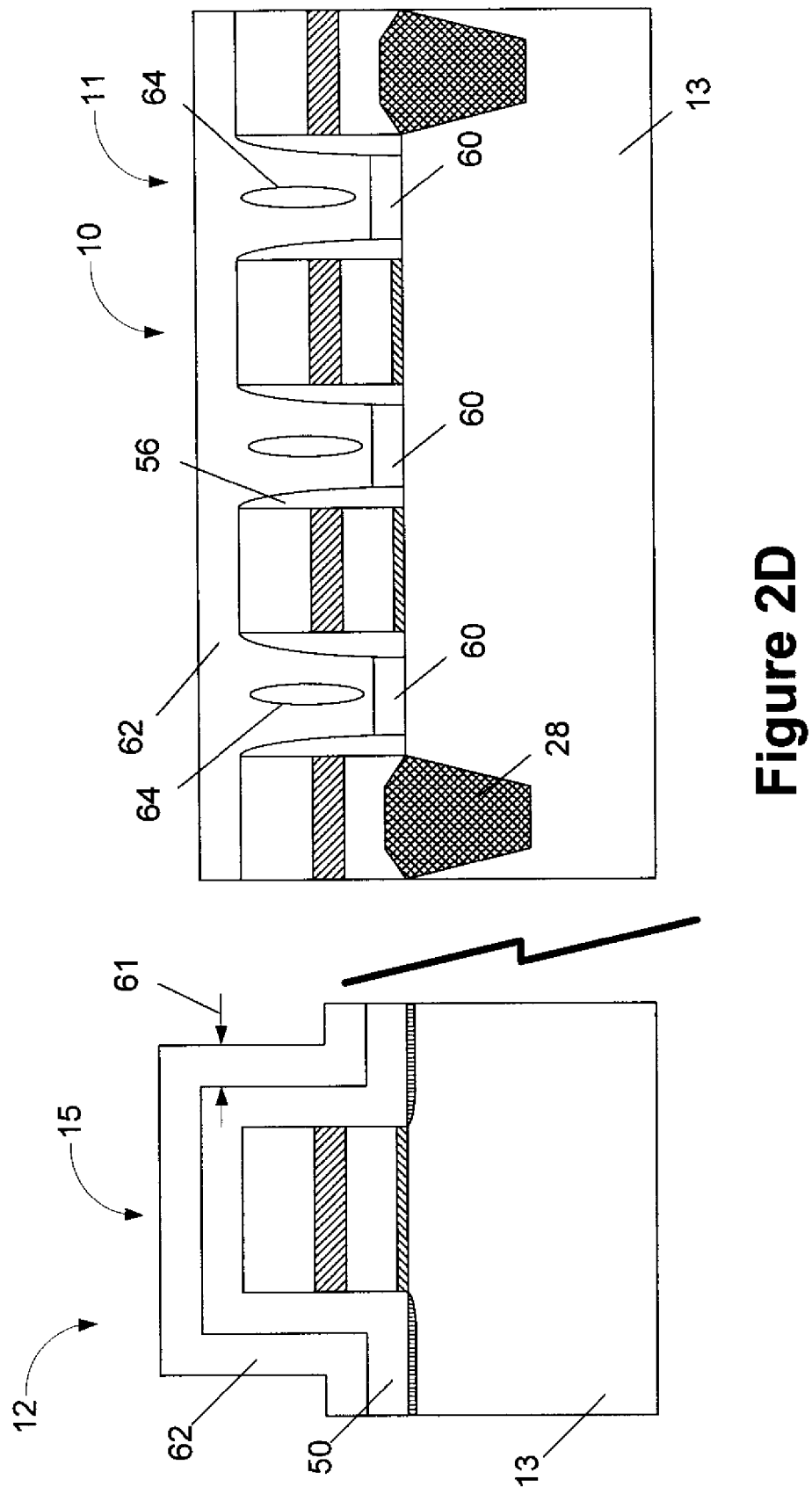

Next, as indicated in FIG. 2D, a layer of insulating material 62 is formed across the substrate 13. The layer of insulating material 62 may be comprised of a variety of materials, e.g., silicon dioxide, silicon oxynitride, oxides of silicon that can be selectively etched with respect to silicon nitride, etc. In other cases, the layer of insulating material may be a carbon-containing film such as an amorphous carbon material or a transparent amorphous carbon material which may be formed in accordance with the disclosures set forth in the following U.S. patent applications: Ser. No. 10/661,100, filed Sep. 12, 2003, entitled "Masking Structure Having Multiple Layers Including an Amorphous Carbon Layer;" Ser. No. 10/661,379, filed Sep. 12, 2003, entitled "Transparent Amorphous Carbon Structure in Semiconductor Devices;" and Ser, No. 10/789,736, filed Feb. 27, 2004, entitled "Transparent Amorphous Carbon Structure in Semiconductor Devices;" all of which are hereby incorporated by reference. In general, as will be discussed more fully below, the layer of insulating material 62 should be comprised of a material that is selectively etchable with respect to the material that comprises the layer of spacer material 50. For example, if the layer of spacer material 50 is comprised of silicon nitride, then the layer of insulating material 62 may be comprised of silicon dioxide, and vice-versa. Of course, many different material combinations are possible.

The layer of insulating material 62 may have a thickness that varies depending upon the particular application. In general, in one example, the thickness 61 of the layer of insulating material 62 may be at least one-half of the spacing 32 between the word lines 11 such that the layer of insulating material 62 reliably fills the space between adjacent word lines 11. In one illustrative embodiment, the layer of insulating material 62 may have a thickness 61 of approximately 25-45 nm.

Moreover, the layer of insulating material 62 may be formed by a variety of known deposition techniques, e.g., chemical vapor deposition, etc. In one illustrative embodiment, the layer of insulating material 62 is a layer of silicon dioxide that is formed by a chemical vapor deposition process using TEOS as a precursor. In one particularly illustrative embodiment, the layer of silicon dioxide 62 should be undensified, i.e., a layer of silicon dioxide deposited at a temperature less than 700° C., such that the etch rate of the undensified layer of insulating material 62 in a subsequent HF etching process will be enhanced relatively to a thermally grown layer of silicon dioxide. While it is not required in all embodiments of the present invention, in one particular example, the target thickness of the layer of insulating material 62 is selected such that the layer of insulating material 62 will form openings or keyholes 64 above the epitaxial silicon 60 in the memory array 10 between the adjacent word lines 11. Thus, in this particular example, the deposition process for the layer of insulating material 62 is selected such that "pinch-off" occurs in the memory array 10. The size and shape of the openings 64 in the layer of insulating material 62 may vary depending upon the particular process parameters used in forming the layer of insulating material as well as the spacing 32 between the word lines 11 in the memory array 10.

Figure 2E:
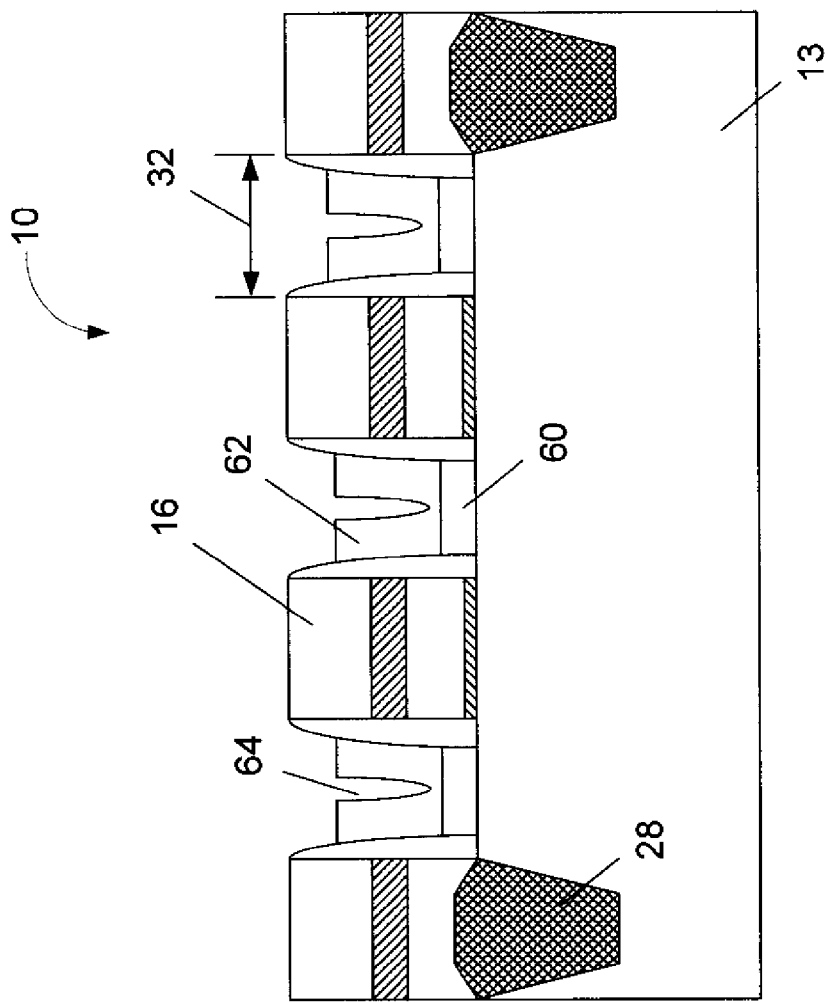
Figure 2E:
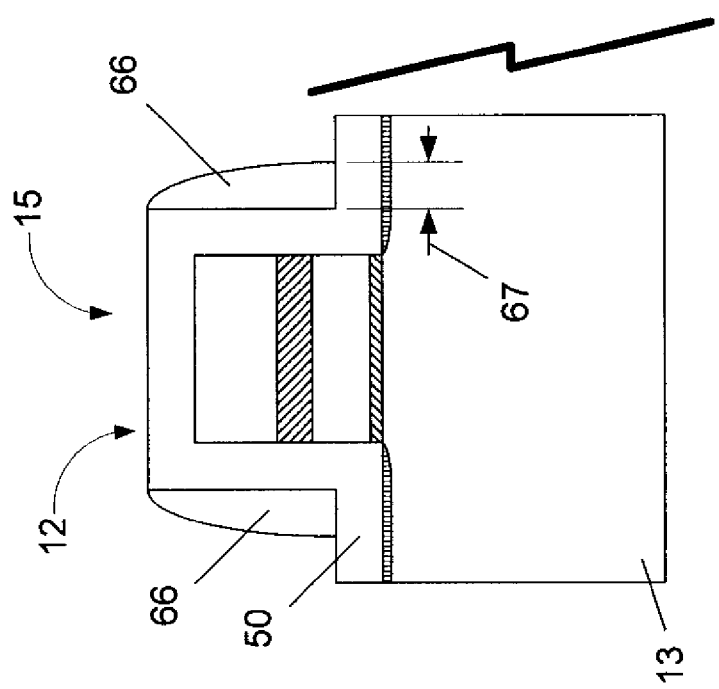

Next, as indicated in FIG. 2E, an anisotropic etching process is performed on the layer of insulating material 62 to thereby define sidewall spacers 66 adjacent the transistor device 15 of the peripheral circuits 12. The combined thickness of the spacer 66 and the spacer 50 must be greater than 0.5 times the space 32 between the word lines 11. Thus, if the space 32 between the word lines 11 can vary from, for example, approximately 50-90 nm for a particular application, the spacer 66 may have a thickness of approximately 25-45 nm. During the etching process used to form the spacer 66, a substantial portion of the insulating layer 62 in the memory array 10 is also cleared. However, in one illustrative embodiment, portions of the insulating layer 62 remain between the word lines 11 of the memory array 10 after the etching process used to define the spacer 66 is completed.

Figure 2F:
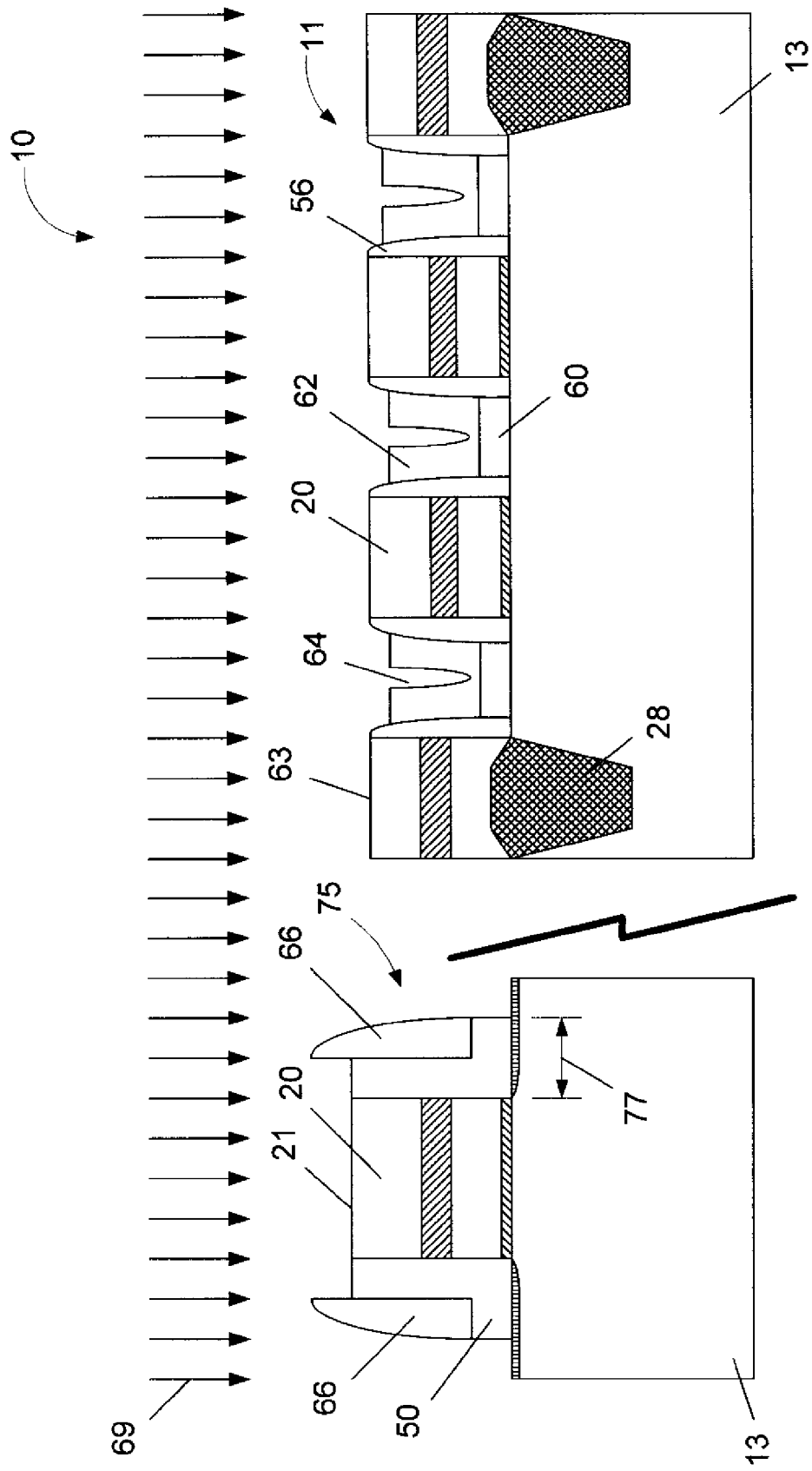
Figure 2G:
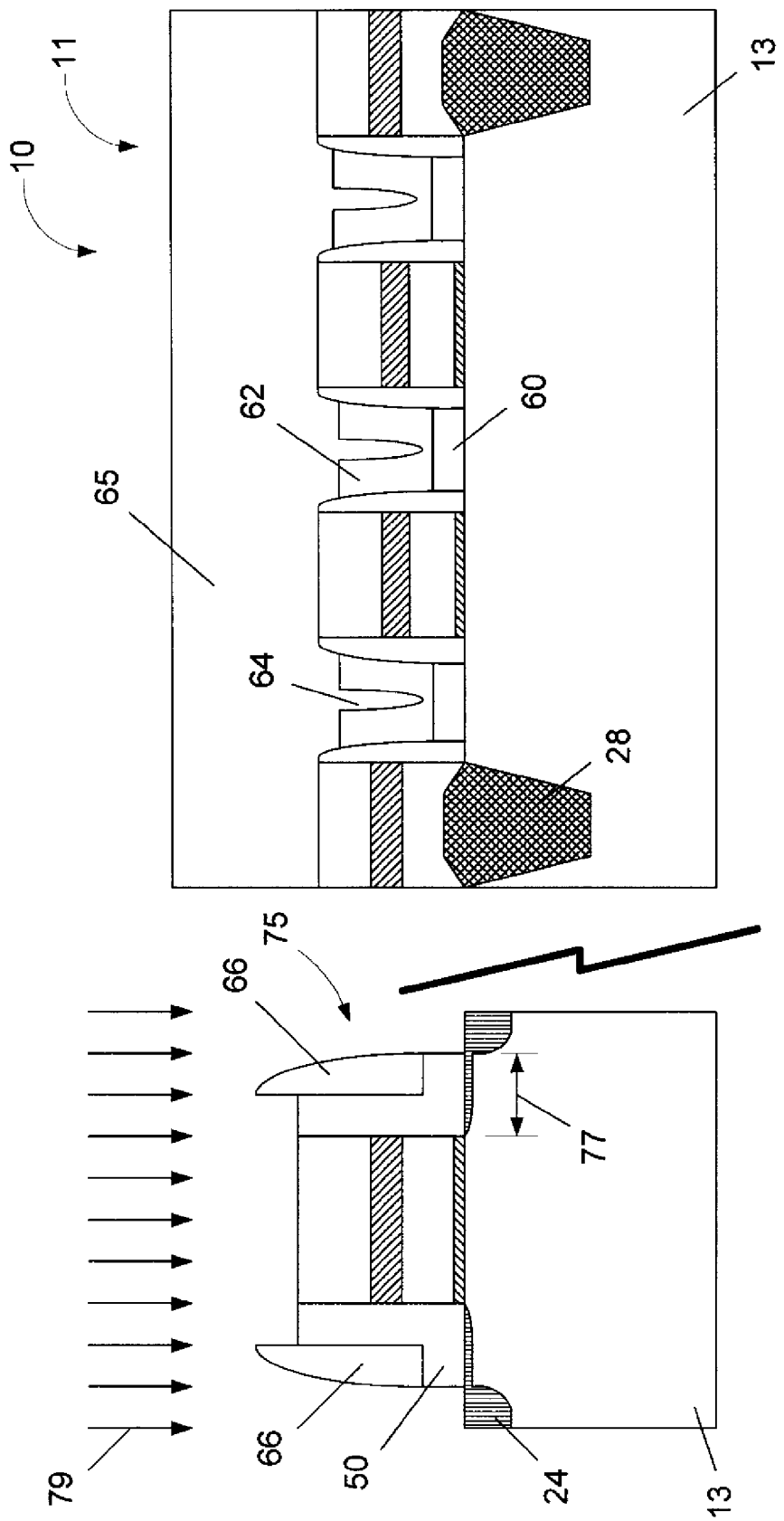

Next, as indicated in FIG. 2F, an etching process, as indicated by the arrows 69, is performed to remove portions of the layer of spacer material 50 that are not protected by the spacers 66. That is, the spacers 66 perform a masking function as it relates to etching the underlying layer of spacer material 50 in the peripheral circuits 12. In the illustrative embodiment wherein the spacer material 50 is comprised of silicon nitride and the masking spacer 66 is comprised of silicon dioxide, the etching process is adapted to selectively remove silicon nitride and not remove the silicon dioxide material, i.e., the masking spacers 66 and the insulating material 64 between the word lines 11. This results in the definition of a composite spacer 75 comprised of a portion of the layer of spacer material 50 and the spacer 66. In one illustrative embodiment, the composite spacer 75 may have a thickness at its base 77 of approximately 35-75 nm. Note that during the etching process 69, the portion of the layer of spacer material 50 above the surface 21 of the nitride cap 20 of the transistor 15 is also removed. Also note that since the memory array 10 is exposed to the etching process 69, there may be a slight reduction in the thickness of the nitride cap layer 20 of the word lines 11 as well as the height of the spacers 56 positioned adjacent the word lines 11 if they are comprised of silicon nitride.

Next, as indicated in 2G, a photoresist mask 65 is formed above the memory array 10 using known photolithography techniques. Thereafter, an ion implantation process, as indicated by the arrow 79, is performed to form the source/drain regions 24 for the transistors 15 in the peripheral circuits 12. Note that during this process, the location of the source/drain implant is determined by the width 77 of the composite spacer 75 formed in the peripheral circuits 12.

Figure 2H:
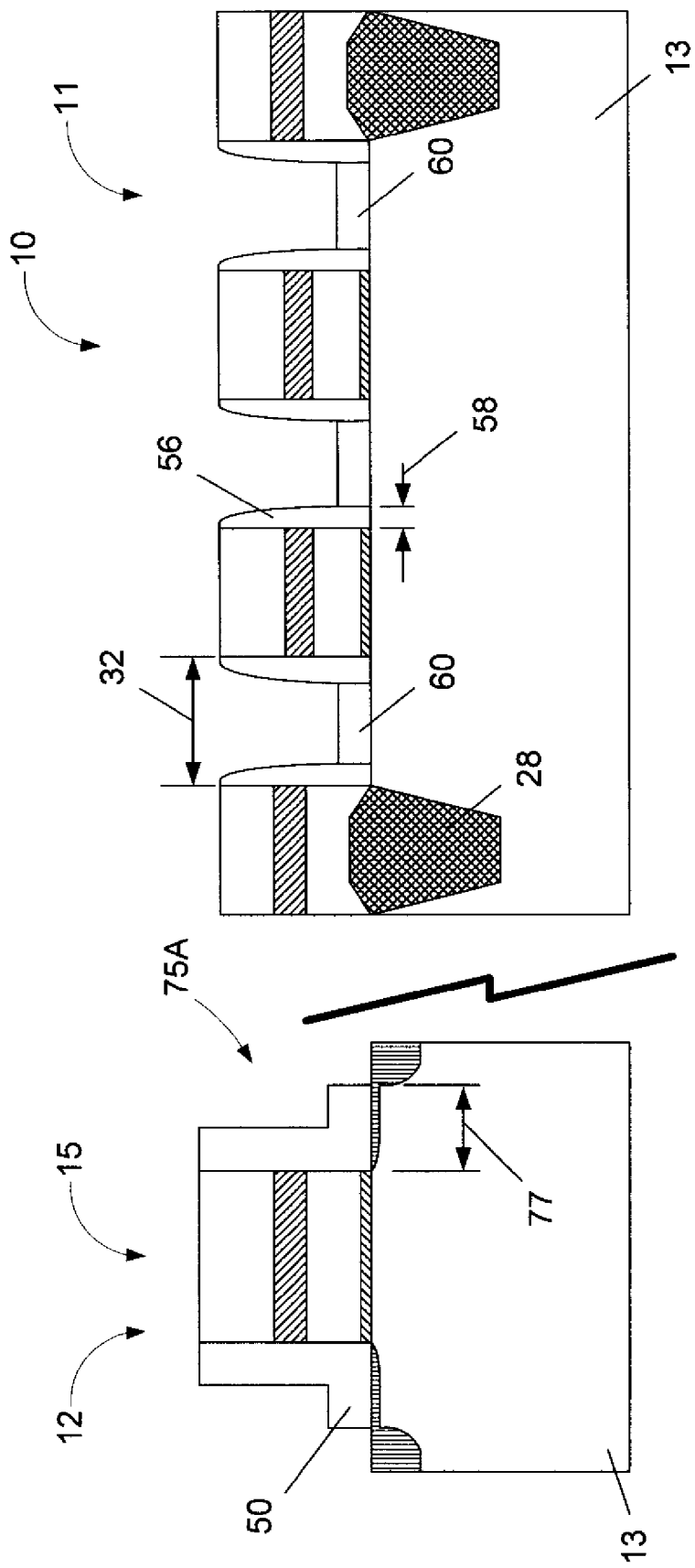

Next, as indicated in FIG. 2H, the next step involves removing the layer of photoresist 65 from above the memory array 10 and performing an etching process using an etchant to selectively remove the remaining portions of the material that comprises the insulating material layer 62, e.g., the spacers 66 formed in the peripheral circuits 12 as well as the portions of the layer of insulating material 62 between the word lines 11 in the memory array 10, while leaving the material of the spacer layer 50 in place. This results in a generally "L" shaped spacer 75A adjacent the transistors 15 in the peripheral circuits 12. In the illustrative example where the layer of insulating material 62 is comprised of silicon dioxide, and the layer of spacer material 50 is comprised of silicon nitride, the etching process may be performed using hydrofluoric acid as the etchant to selectively remove the silicon dioxide material relative to the silicon nitride material. Of course, other material combinations and etchants may be employed in accordance with the teachings of the present invention. Note that during this process, the layer of epitaxial silicon 60 serves to protect the substrate 13 within the memory array 10. During this hydrofluoric acid etching process, the undensified nature of the layer of insulating material 62 as well as the presence of the openings 64 will tend to reduce the etch time required to completely remove the silicon dioxide material. Thus, there should be minimum loss of silicon dioxide material in various other portions of the device, e.g., such as a shallow trench isolation region. Specifically note that, in accordance with the illustrative embodiment depicted herein, the thickness 77 of the spacer 75A adjacent the transistors 15 in the peripheral circuits 12 is greater than that of the thickness 58 of the spacers 56 in the memory array 10.

The present invention is generally directed to a method of manufacturing sidewall spacers on a memory device, and a memory device comprising such sidewall spacers. In one illustrative embodiment, the method comprises forming sidewall spacers on a memory device comprised of a memory array and at least one peripheral circuit by forming a first sidewall spacer adjacent a word line structure in the memory array, the first sidewall spacer having a first thickness and forming a second sidewall spacer adjacent a transistor structure in the peripheral circuit, the second sidewall spacer having a second thickness that is greater than the first thickness, wherein the first and second sidewall spacers comprise material from a single layer of spacer material.

In another illustrative embodiment, the method comprises forming a layer of spacer material above a word line structure of a memory array of a memory device and above a transistor structure of a peripheral circuit of the memory device, forming a masking layer above the layer of spacer material positioned above the transistor structure of the peripheral circuit, and performing an etching process on the layer of spacer material above the word line structure to define a first sidewall spacer for the word line structure, the first sidewall spacer being comprised of the spacer material and having a first thickness.

In yet another illustrative embodiment, the method comprises depositing a layer of spacer material above a word line structure of a memory array of a memory device and above a transistor structure of a peripheral circuit of the memory device, forming a masking layer above the layer of spacer material positioned above the transistor structure of the peripheral circuit, and performing an anisotropic etching process on the layer of spacer material above the word line structure to define a first sidewall spacer for the word line structure, the first sidewall spacer being comprised of the spacer material and having a first thickness. The method further comprises forming a layer of epitaxial silicon on exposed portions of a semiconducting substrate between first sidewall spacers positioned on adjacent word line structures in the memory array, removing the masking layer, and depositing a layer of material above the layer of spacer material adjacent the transistor structure and above the word line structure and the first sidewall spacer, the layer of material being comprised of a material that is selectively etchable with respect to the layer of spacer material. The method further involves performing an anisotropic etching process on the layer of material to define a masking spacer adjacent the layer of spacer material adjacent the transistor structure, and performing an etching process on the layer of spacer material using the masking spacer as a mask to define a second sidewall spacer adjacent the transistor structure, the second sidewall spacer being comprised of the spacer material and having a second thickness that is greater than the first thickness of the first sidewall spacer.

In one illustrative embodiment, the device comprises a memory array comprised of a plurality of word line structures, each of the plurality of word line structures having a first sidewall spacer formed adjacent thereto, the first sidewall spacer having a first thickness, and a peripheral circuit comprised of at least one transistor having a second sidewall spacer formed adjacent thereto, the second sidewall spacer having a second thickness that is greater than the first thickness, the first and second sidewall spacers comprised of a material from a single layer of spacer material.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method of forming sidewall spacers on a memory device comprised of a memory array and at least one peripheral circuit, comprising:

forming a first sidewall spacer on exposed sidewall surfaces of a word line structure and contacting a semiconductive substrate in said memory array, said first sidewall spacer having a first thickness; and forming a second sidewall spacer against exposed sidewall surfaces of a transistor gate structure and contacting the semiconductive substrate in said at least one peripheral circuit, said second sidewall spacer being L-shaped and having a second thickness that is greater than said first thickness, wherein said first and second sidewall spacers are formed from only a single layer of spacer material.

2. The method of claim 1, wherein said first and second sidewall spacers are formed of a single material that is selected from the group consisting of silicon nitride, silicon dioxide and silicon oxynitride.

3. The method of claim 1, wherein said first sidewall spacer has a thickness ranging from approximately 15-27 nm and said second sidewall spacer has a thickness ranging from approximately 45-90 nm.

4. The method of claim 1, wherein forming said first and second sidewall spacers comprises:

forming said layer of spacer material above said word line structure in said memory array and on said exposed sidewalls of said transistor gate structure in said at least one peripheral circuit;

forming a masking layer above said layer of spacer material in said at least one peripheral circuit; and performing an anisotropic etching process on said layer of spacer material formed above said word line structure to thereby define said first sidewall spacer having said first thickness.

5. The method of claim 4, wherein forming said second sidewall spacer comprises:

removing said masking layer;

forming a layer of material above said layer of spacer material formed on said exposed sidewalls of said transistor gate structure and above said word line structure in said memory array, said layer of material being selectively etchable with respect to said layer of spacer material; and performing an anisotropic etching process on said layer of material to define a masking spacer adjacent said layer of spacer material that is formed on said exposed sidewalls of said transistor gate structure in said peripheral circuit.

6. A method of forming sidewall spacers on a memory device comprised of a memory array and at least one peripheral circuit, comprising:

forming a first sidewall spacer on exposed sidewall surfaces of a word line structure in said memory array, said first sidewall spacer having a first thickness; and forming a second sidewall spacer on exposed sidewall surfaces of a transistor gate structure and in contact with a semiconductive substrate in said at least one peripheral circuit, said second sidewall spacer being L-shaped having a second thickness that is greater than said first thickness, wherein said first and second sidewall spacers are formed from only a single layer of spacer material.

7. The method of claim 6, wherein said first and second sidewall spacers are formed of a single material that is selected from the group consisting of silicon nitride, silicon dioxide and silicon oxynitride.

8. The method of claim 6, wherein said first sidewall spacer has a thickness ranging from approximately 15-27 nm and said second sidewall spacer has a thickness ranging from approximately 45-90 nm.

9. The method of claim 6, wherein forming said first and second sidewall spacers comprises:

forming said layer of spacer material above said word line structure in said memory array and above said transistor gate structure in said at least one peripheral circuit;

forming a masking layer above said layer of spacer material in said at least one peripheral circuit; and performing an anisotropic etching process on said layer of spacer material formed above said word line structure to thereby define said first sidewall spacer having said first thickness.

10. The method of claim 9, wherein forming said second sidewall spacer comprises:

removing said masking layer;

forming a layer of material above said layer of spacer material adjacent said transistor gate structure and above said word line structure in said memory array, said layer of material being selectively etchable with respect to said layer of spacer material; and performing an anisotropic etching process on said layer of material to define a masking spacer adjacent said layer of spacer material that is adjacent said transistor gate structure in said peripheral circuit.

11. The method of claim 10, further comprising, prior to forming said layer of material, growing a protective layer on exposed portions of a semiconducting substrate between first sidewall spacers positioned on adjacent word lines in said memory array.

12. The method of claim 11, wherein growing said protective layer comprises growing a layer of epitaxial silicon.

13. The method of claim 10, wherein forming said layer of material above said layer of spacer material comprises performing a deposition process to form a densified layer of material above said layer of spacer material.

14. The method of claim 6, wherein said memory device comprises at least one of a dynamic random access memory device and a flash memory device.

15. The method of claim 9, wherein forming said layer of spacer material comprises conformally depositing said layer of spacer material.

16. The method of claim 9, wherein forming a masking layer comprises forming a masking layer comprised of a photoresist material.

17. The method of claim 10, wherein forming said layer of material above said layer of spacer material comprises depositing said layer of material above said layer of spacer material.

* * * * *

UNITED STATES PATENT AND TRADEMARK OFFICE
CERTIFICATE OF CORRECTION

PATENT NO. : 7,601,591 B2  Page 1 of 1
APPLICATION NO. : 12/020752
DATED : October 13, 2009
INVENTOR(S) : David K. Hwang et al.

It is certified that error appears in the above-identified patent and that said Letters Patent is hereby corrected as shown below:

On the Title page, in Item (62), under "Related U.S. Application Data", in column 1, line 1, below "Prior Publication Data" insert -- 62.  Related U.S. Application Data This application is a continuation of application Ser. No. 11/132,472 filed on May 19, 2005, now Pat. No. 7,341,906. --.

In column 1, line 4, below "Title" insert -- This application is a continuation of application Ser. No. 11/132,472 filed on May 19, 2005, now Pat. No. 7,341,906. --.

Signed and Sealed this

Twenty-ninth Day of December, 2009

David J. Kappos
*Director of the United States Patent and Trademark Office*